United States Patent
Chao et al.

(10) Patent No.: US 7,391,281 B2
(45) Date of Patent: Jun. 24, 2008

(54) METHOD FOR SUPPRESSING RESONANT EFFECT BETWEEN CAPACITORS CONNECTED IN PARALLEL

(75) Inventors: Shih-Chieh Chao, Taipei (TW); Chih-Wen Huang, Taipei (TW); Chun-Lin Liao, Taipei (TW)

(73) Assignee: Tatung Company, Taipei (TW)

( * ) Notice: Subject to any disclaimer, the term of this patent is extended or adjusted under 35 U.S.C. 154(b) by 261 days.

(21) Appl. No.: 11/437,724

(22) Filed: May 22, 2006

(65) Prior Publication Data

US 2007/0035355 A1 Feb. 15, 2007

(30) Foreign Application Priority Data

Aug. 12, 2005 (TW) .............................. 94127438 A

(51) Int. Cl.
*H03H 7/38* (2006.01)
(52) U.S. Cl. ............................................. 333/33; 333/32
(58) Field of Classification Search .................... 333/33, 333/32, 263, 35
See application file for complete search history.

(56) References Cited

U.S. PATENT DOCUMENTS

2002/0149439 A1* 10/2002 Toncich .................... 333/24.2

* cited by examiner

*Primary Examiner*—Stephen E Jones
(74) *Attorney, Agent, or Firm*—Bacon & Thomas, PLLC.

(57) ABSTRACT

A method for suppressing the resonant effect between capacitors connected in parallel is disclosed. By adjusting the length of the transmission line of the shunt capacitors, the performance of the shunt capacitors, which can be applied on various types of filtering circuits, can be improved in the desired bandwidth.

4 Claims, 6 Drawing Sheets

METHOD FOR SUPPRESSING RESONANT EFFECT BETWEEN CAPACITORS CONNECTED IN PARALLEL

BACKGROUND OF THE INVENTION

1. Field of the Invention

The present invention relates to a method for suppressing the resonant effect between capacitors connected in parallel (shunt capacitors) by adjusting the length of the transmission lines between the shunt capacitors and, more particularly, to a method of adjusting the length of the transmission lines that applies to the $\pi$-filter circuit.

2. Description of Related Art

For the purpose of noise suppression or signal filtering, different filtering structures are required in designing circuits. In order to increase the capacitance or using the multi-stage structure, shunt capacitors are used in these filtering structures, and which require two or more capacitors connected in parallel. However, the finite series inductance of the capacitor mounted on PCB will limit the performance in some frequencies. Usually the equivalent circuit of a single capacitor is modeled as the series of a capacitor, resister and inductor. There exists the series resonance in the finite series inductance and the capacitance of the capacitor, which limits the performance of the shunt capacitors. In order to suppress the unwanted resonant effect, one method is using several identical capacitors. However, the bandwidth of this structure is still not wide enough.

FIG. 1 illustrates the equivalent circuit of a single capacitor. Its equivalent inductance and resistance are assumed to be 0.5 nH and 0.1 $\Omega$ respectively. The inductance comes from the inner conductor of the capacitor, and the resistance is from the conductor loss of the element.

FIG. 2 shows the frequency responses of a single capacitor and two capacitors connected in parallel. A single capacitor with a capacitance of 400 pF, a series resistance of 0.1 $\Omega$, and a series inductance of 0.5 nH has the lowest impedance around the frequency of 350 MHz. This corresponds to the series resonance frequency formed by the series of the capacitance and the equivalent inductance. On the other hand, if two capacitors of capacitance 200 pF and 600 pF are connected in parallel, there exists two local minimum of impedance at 300 MHz and 500 MHz, which corresponds to the series resonant frequency of each capacitor. However, this structure creates an impedance peak at 400 MHz. This impedance peak comes from the parallel resonance between the capacitance in one capacitor and the inductance in the other capacitor. This resonant effect limits the performance of shunt capacitors in the frequency band of interest.

Further, to avoid parallel resonance while decreasing the impedance, it is common to have multiple identical capacitors connected in parallel as shown in FIG. 3. Though such method will not result in any impedance peak, which comes from the parallel resonance between the capacitors, the bandwidth will still not be wide enough.

From the above, conventional capacitors connected in parallel are not capable of either effectively suppressing resonant effect or increasing the bandwidth; therefore, it is desirable to come up with an improved method to overcome the above flaws.

SUMMARY OF THE INVENTION

The main objective of the present invention is to provide a method for suppressing resonant effect between capacitors connected in parallel by adjusting the length of the transmission lines between the capacitors. With the properly selecting of the structure parameters such as characteristic impedance, length of the transmission line, and capacitances of two capacitors, the resonant effect between the shunt capacitors can be suppressed.

The present invention relates to a method for suppressing resonant effect between the shunt capacitors by adjusting the length of the transmission lines between the capacitors, in which the capacitors connected in parallel comprise an equivalent circuit having a first capacitor, an equivalent circuit having a second capacitor and a transmission line in between, and with which the equivalent circuits for said shunt capacitors. Further, the method for adjusting the length of the transmission lines comprises the following steps: (A) selecting a frequency range, where the frequency range is the bandwidth of the shunt capacitors circuit, and the bandwidth includes a maximum frequency and a minimum frequency; (B) calculating the characteristic impedance of the transmission line subject to the constraint on the width of the transmission line; (C) calculating a first capacitance of the equivalent circuit having the first capacitor subject to the median of said frequency range; (D) calculating a second capacitance of the equivalent circuit having the second capacitor subject to the minimum of said frequency range; and (E) adjusting the length of the transmission line subject to the equivalent circuit having said first capacitor, the equivalent circuit having said second capacitor and the characteristic impedance of said transmission line. Consequently, by properly adjusting both the characteristic impedance value and the length of the transmission line in the shunt capacitors circuit, the parallel resonance caused by the serial inductance can be effectively suppressed, ultimately achieving a state of broadband.

The above-mentioned method for suppressing resonance between shunt capacitors can also be applied on a filter that is constructed with equivalent circuits for three or more capacitors; various filtering effects can be achieved by simply adjusting the locations of the capacitors in a circuit.

The above-mentioned method for suppressing resonance between shunt capacitors can further shorten the length of the filter, using the technique of sharing the length of a transmission line to reduce the area of the circuit therefore.

DETAILED DESCRIPTION OF THE PREFERRED EMBODIMENT

Figure 1:
FIG. 1 is the equivalent circuit of a single capacitor.
Figure 2:
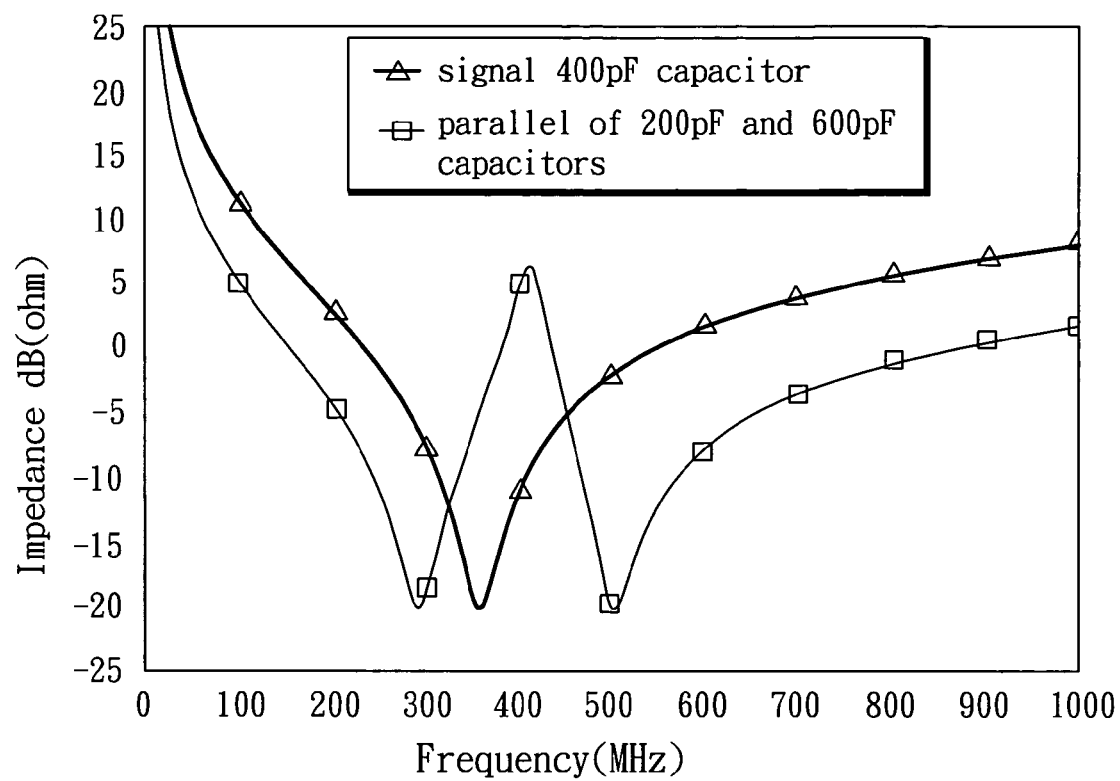
FIG. 2 is a prior art frequency response of impedances of one capacitor and two capacitors connected in parallel.
Figure 3:
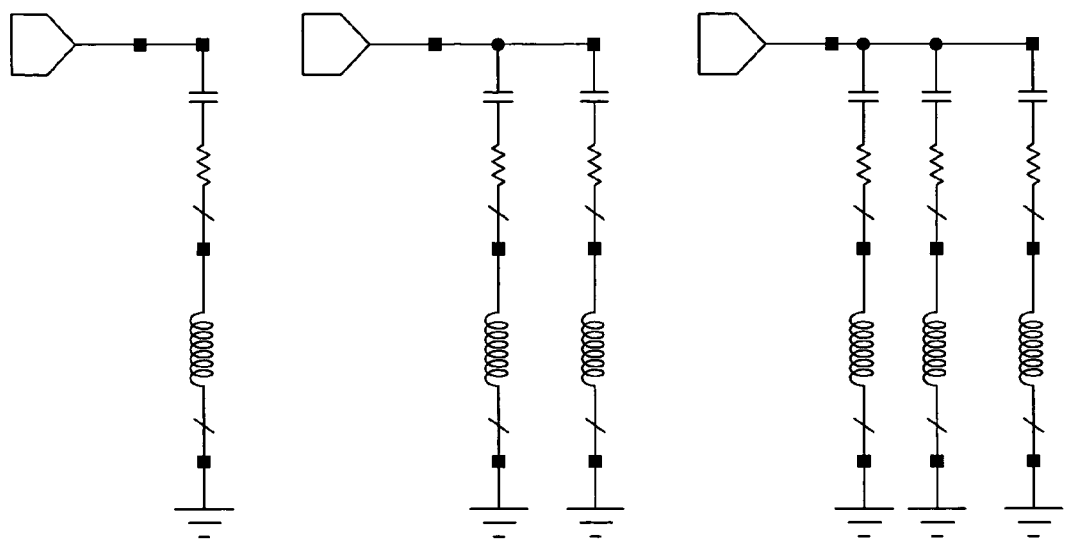
FIG. 3 is the equivalent circuit of single capacitor, two shunt capacitors and three shunt capacitors.
Figure 4:
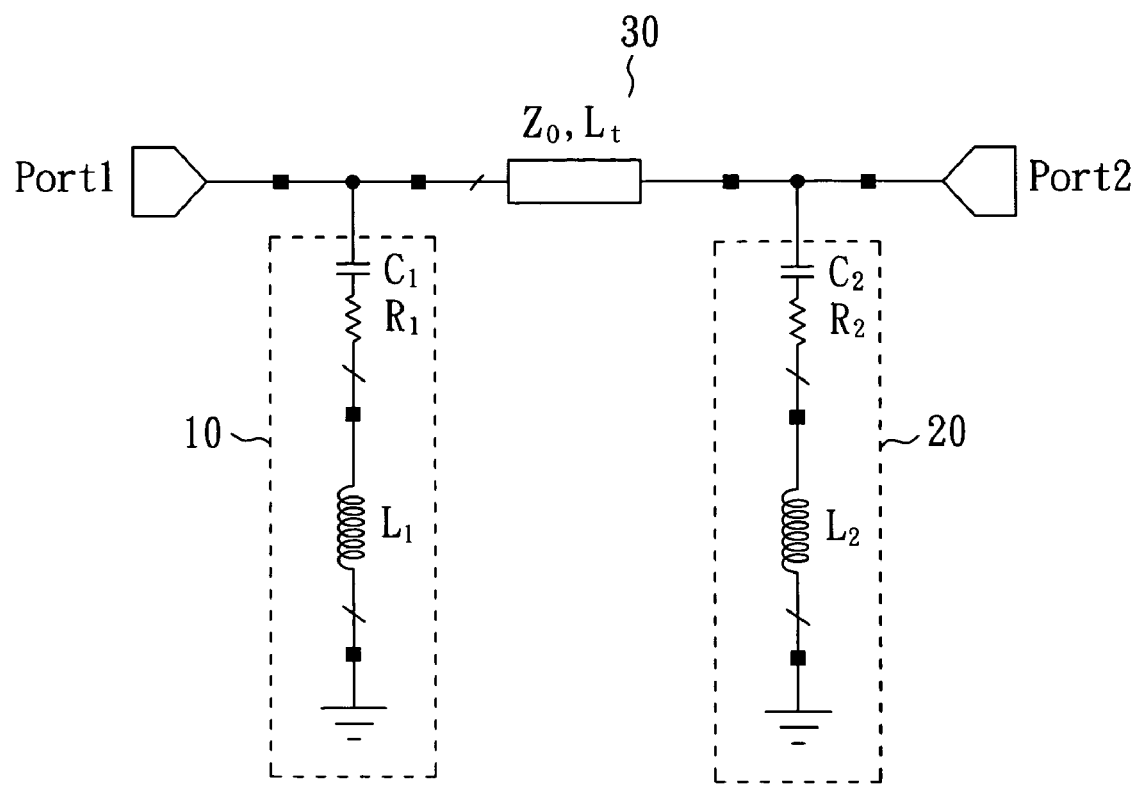
FIG. 4 is a single $\pi$-filter circuit of a preferred embodiment according to the present invention.

Referring to the circuit layout in FIG. 4 as one of the preferred embodiments of the present invention, the filtering circuit of the present invention comprises an equivalent circuit of the first capacitor 10, an equivalent circuit of the second capacitor 20 and a transmission line 30. Further, the transmission line 30 connects the equivalent circuit of the first capacitor 10 and the equivalent circuit of the second capacitor 20. In this embodiment, the equivalent circuit of the first capacitor 10 and the equivalent circuit of the second capacitor 20 each comprise a resistor, a capacitor and an inductor (R1, C1, L1 and R2, C2, L2). The values of R1, R2, L1 and L2 of the circuit correspond to either the devices themselves and/or the manufacture of the circuit board and therefore cannot be altered arbitrarily. The transmission line 30 is to connect the equivalent circuit having the first capacitor 10 with the equivalent circuit having the second capacitor 20; the present invention suppresses the resonance between two capacitors (C1 and C2) by selecting the characteristic impedance and the length of the transmission line 30. In this embodiment, the width of the transmission line 30 is inverse proportional to its characteristic impedance; that is, the thinner the width of the transmission line 30 becomes, the higher the characteristic impedance will be, thus requiring a transmission line with a shorter length.

In the present invention, the filtering effect from the filtering circuit is assessed with the transmission coefficient of the scattering parameters. As the transmission coefficient decreases, it implies that energy of a signal on one side is more difficult to reach the other side of the circuit; on the contrary, as the transmission coefficient increases (approaching 0 dB), it implies that it becomes easier for energy of a signal on one side to reach the other side of the circuit.

Referring again to the circuit layout in FIG. 4, adjusting the length ($L_t$) of the transmission line 30 can alter the resonant effect between two capacitors. As length ($L_t$) begins to increase from 0, the resonant effect between two capacitors will gradually weaken to a point where the length of the transmission line 30 reaches an optimized value, whereby the resonance between two capacitors can almost be fully suppressed. When the length of the transmission line 30 exceeds its optimized value, the resonance between two capacitors will again take place and gradually become worse as the length of the transmission line 30 continues to increase. The optimized length of the transmission line 30 also relates to other parameters in the circuit. Generally speaking, if, in FIG. 4, the difference in capacitance between the two capacitors becomes larger, or the characteristic impedance ($Z_0$) of the transmission line 30 decreases, that optimized length will increase accordingly. However, circuit layout designers in practice would not necessarily adjust the length of the transmission line 30 to the optimized value instead lowering the resonant effect to be suppressed to within an acceptable range will be sufficient.

Figure 5:
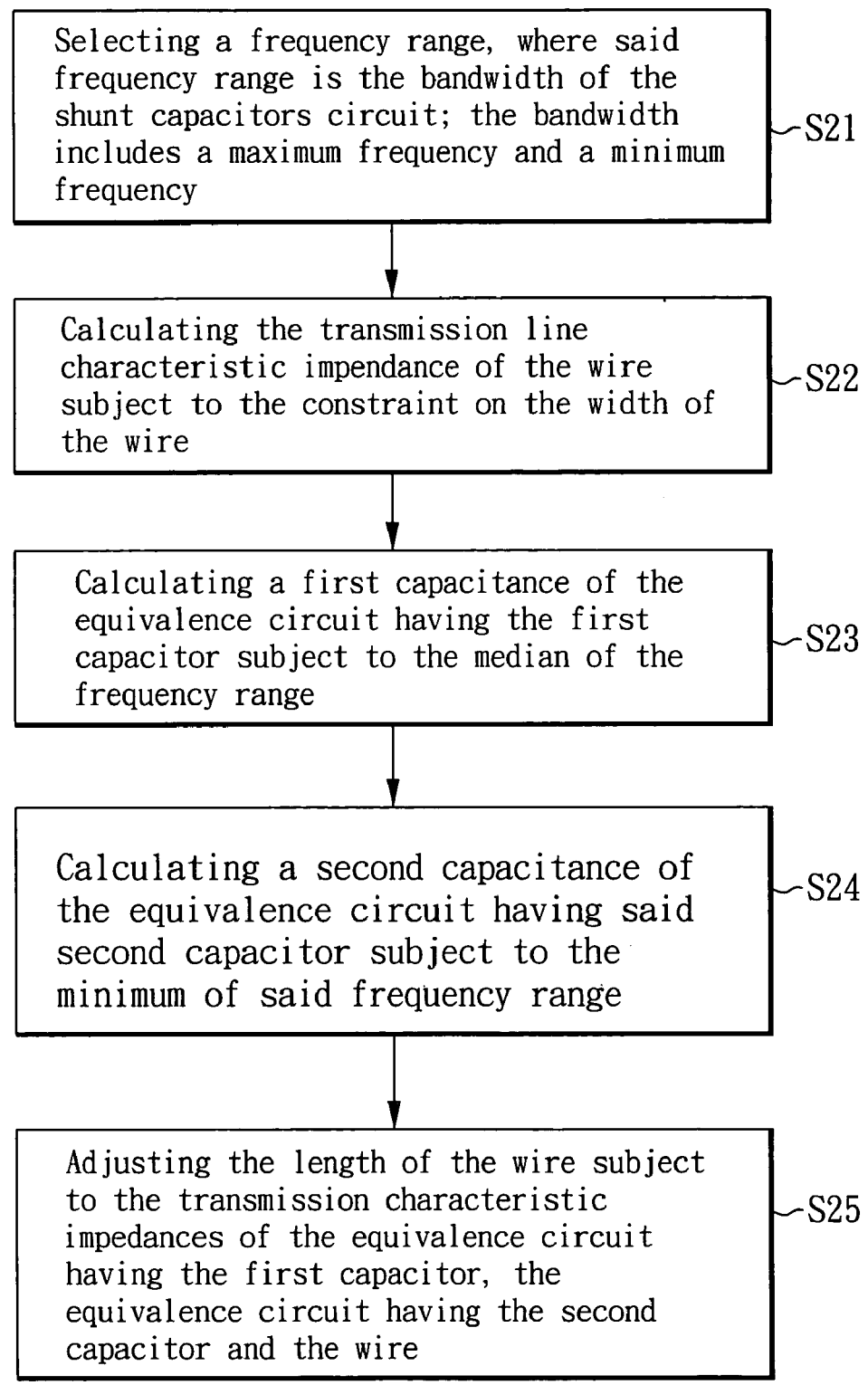
FIG. 5 is the block diagram illustrating a preferred embodiment of suppressing resonance between shunt capacitors according to the present invention.

In the filtering structure shown in FIG. 4, adjusting different capacitances can lead to different filtering effects. Referring to FIG. 5, the method of the present invention for suppressing resonance between shunt capacitors is employed by the mean of adjusting the length of the transmission line in the circuit, comprising the following steps:

First of all, a frequency range is determined as the operating frequencies of the shunt capacitors circuit, in which the frequencies include a maximum frequency and a minimum frequency (Step S21).

Followed the above step, the characteristic impedance of the transmission line is then calculated subject to the width constraint on that transmission line (Step S22). Due to limitations on the manufacture of the circuit board affecting the width of the transmission line 30, infinite downsizing becomes unfeasible, hindering the possibility to infinitely increase the characteristic impedance of the transmission line 30 arbitrarily. Calculating the characteristic impedance of the transmission line 30 is a well-known art in the related field; therefore it will be not further described herein.

The first capacitance of the equivalent circuit having the first capacitor 10 is the calculated subject to the median of the frequency range. (Step S23) For example, as the frequency range selected by the filtering circuit falls between 200 MHz ~500 MHz, assuming the equivalence inductance and the equivalence resistance equal to 0.5 nH and 0.1Ω respectively, Using $$\text{frequency} = \frac{1}{2*\pi*\sqrt{L*C}}$$

$$\text{frequency} = \frac{1}{2*\pi\sqrt{L*C}}$$

To set the minimum impedance of the first capacitor at the median of the frequency range as order.

Therefore, selecting the median 350 MHz of the frequency range as the standard, the first capacitance (C1) is calculated as follows:

$$2*\pi*\frac{(200*10^6 + 500*10^6)}{2} = \frac{1}{\sqrt{0.5*10^{-9}*C1}}$$

The result of the first capacitance C1 is equal to 400 pF.

Then the second capacitance of the equivalent circuit having the second capacitor 20 is calculated subject to the minimum frequency of the above frequency range (Step S24). By setting the minimum impedance of the second capacitor at the minimum frequency range as order and selecting 200 MHz as the standard, the second capacitance (C2) is calculated as follows:

$$2*\pi*200*10^6 = \frac{1}{\sqrt{0.5*10^{-9}*C2}}$$

The result of the second capacitance C2 is equal to 1200 pF.

Finally, the length of the wire is properly adjusted subject to the equivalent circuit having the first capacitor 10, the equivalent circuit having the second capacitor 20 and the transmission characteristic impedance of said transmission line. (Step S25) In this embodiment, assuming the characteristic impedance of the transmission line equals to 50Ω, the optimized length of the wire ($L_t$) will then be equal to 3.3 mm.

Referring to the circuit layout shown in FIG. 4, the filtering circuit of the present invention utilizes the 3.3 mm transmission line 30 with the characteristic impedance ($Z_0$) at 50Ω to connect two capacitors (C1=400 pF and C2=1200 pF). The resonant effect due to parasitic inductance can be effectively suppressed with proper selections for the characteristic impedance ($Z_0$) and the length ($L_t$) of the transmission line.

Figure 6:
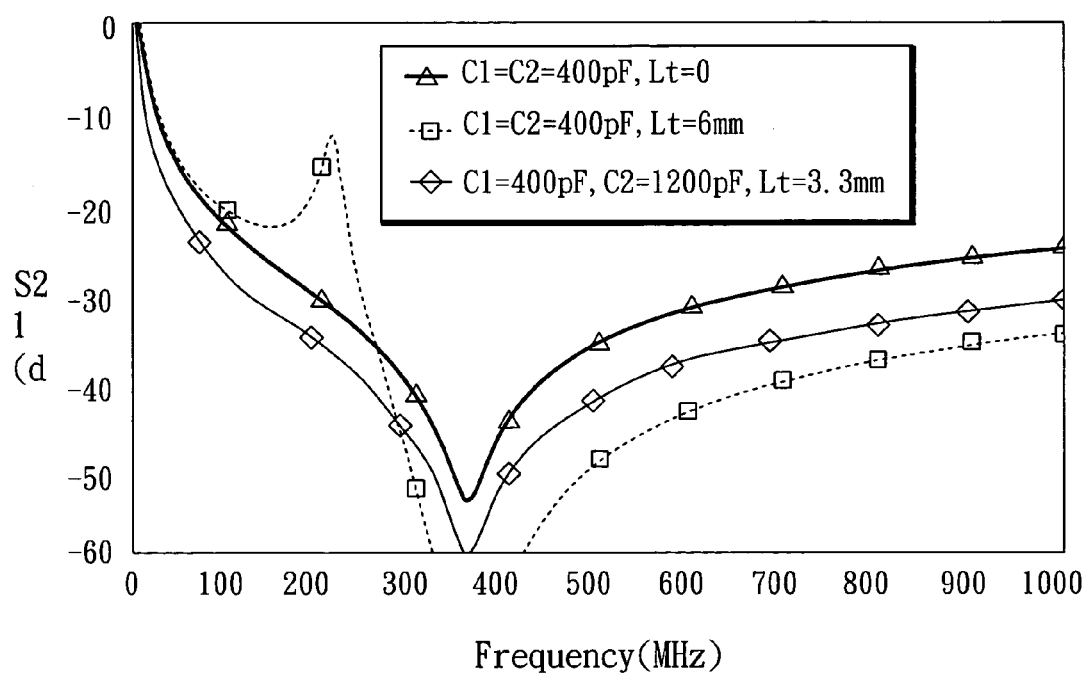
FIG. 6 is the frequency response of a preferred embodiment according to the present invention.

Referring to the frequency response diagram in FIG. 6, first of all, two capacitors, each having 400 pF, are connected in parallel without adding the connection with the transmission line ($L_t$=0). This kind of connection is the conventional method to avoid parallel resonant effect due to the presence of serial inductors, where a minimum value for the transmission coefficient is at 350 MHz.

Secondly, two capacitors, each having 400 pF, are connected in parallel with a 6 mm transmission line with its characteristic impedance at 50Ω. This kind of connection allows a lower transmission coefficient at around 350 MHz; however, due to the length of the transmission line, which is not properly complied with the capacitance, a peak value of the transmission coefficient appears at around 210 MHz, implying that the filtering effect at the range is defective.

Thirdly, two capacitors, with one having 400 pF and the other having 1200 pF, are connected in parallel with a transmission line at the optimized length of 3.3 mm long. As shown in FIG. 6, the resonant effect has been significantly suppressed while the transmission coefficient yields a better result than that employing the conventional method with only two 400 pF shunt capacitors filtering structure.

From the above it is known that the method of the present invention for suppressing resonance between shunt capacitors by adjusting the length of the transmission line between the shunt capacitors can effectively suppress the resonant effect due to the parasitic inductance effect in the circuit. Also the method can further shorten the length of the filtering structure, allowing the area of the circuit to be significantly reduced. The method of the present invention is not limited to second-order filtering circuits, but can also be applied on any filtering structure comprising equivalent circuits having more than three capacitors.

Although the present invention has been explained in relation to its preferred embodiment, it is to be understood that many other possible modifications and variations can be made without departing from the scope of the invention as hereinafter claimed.

What is claimed is:

1. A method for suppressing resonant effect between shunt capacitors by adjusting the length of the transmission line of said shunt capacitors, comprising an equivalent circuit having a first capacitor, an equivalent circuit having a second capacitor and a transmission line, said equivalent circuits for said shunt capacitors; said method comprising the steps of:
   (A) selecting a frequency range, where said frequency range is the bandwidth of said shunt capacitors circuit, said bandwidth includes a maximum frequency and a minimum frequency;
   (B) calculating the characteristic impedance of said transmission line subject to the constraint on the width of said transmission line;
   (C) calculating said first capacitance of the equivalent circuit having said first capacitor subject to the median of said frequency range;
   (D) calculating said second capacitance of the equivalent circuit having said second capacitor subject to the minimum of said frequency range; and
   (E) adjusting the length of said transmission line subject to the equivalent circuit having said first capacitor, the equivalent circuit having said second capacitor and the characteristic impedance of said transmission line.

2. The method as claimed in claim 1, wherein said first capacitor and said second capacitor both comprise a resistor, a capacitor and an inductor.

3. The method as claimed in claim 1, wherein said frequency range is determined subject to the circuit of said shunt capacitors.

4. The method as claimed in claim 1, wherein the width of said transmission line is determined subject to the limitations on the manufacture of said circuit board, wherein, as the width of said transmission line becomes smaller, the characteristic impedance of said transmission line increases.

* * * * *